US009153439B2

(12) United States Patent
Kumegawa et al.

(10) Patent No.: US 9,153,439 B2
(45) Date of Patent: Oct. 6, 2015

(54) METHOD FOR ETCHING A GROUP III NITRIDE SEMICONDUCTOR, METHOD FOR PRODUCING A GROUP III NITRIDE SEMICONDUCTOR CRYSTAL, AND METHOD FOR PRODUCING A GAN SUBSTRATE

(71) Applicant: TOYODA GOSEI CO., LTD., Kiyosu-shi (JP)

(72) Inventors: Shohei Kumegawa, Kiyosu (JP); Yasuhide Yakushi, Kiyosu (JP); Seiji Nagai, Kiyosu (JP); Miki Moriyama, Kiyosu (JP)

(73) Assignee: Toyoda Gosei Co., Ltd, Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/300,927

(22) Filed: Jun. 10, 2014

(65) Prior Publication Data
US 2014/0363954 A1 Dec. 11, 2014

(30) Foreign Application Priority Data

Jun. 11, 2013 (JP) .................................. 2013-123189

(51) Int. Cl.
*H01L 21/02* (2006.01)
*H01L 21/308* (2006.01)

(52) U.S. Cl.
CPC ...... *H01L 21/02658* (2013.01); *H01L 21/0243* (2013.01); *H01L 21/0254* (2013.01); *H01L 21/02389* (2013.01); *H01L 21/02625* (2013.01); *H01L 21/3081* (2013.01)

(58) Field of Classification Search
None
See application file for complete search history.

(56) References Cited

U.S. PATENT DOCUMENTS

| 6,979,584 B2 | 12/2005 | Koike et al. |
| 7,176,115 B2 | 2/2007 | Kitaoka et al. |
| 7,560,725 B2 | 7/2009 | Koike et al. |
| 2003/0092263 A1 | 5/2003 | Koike et al. |
| 2004/0089919 A1 | 5/2004 | Motoki et al. |

(Continued)

FOREIGN PATENT DOCUMENTS

| CN | 1413357 A | 4/2003 |
| CN | 1429401 A | 7/2003 |

(Continued)

OTHER PUBLICATIONS

Japanese Office Action for Japanese Patent Application No. 2012-062530 dated Jun. 3, 2014 with a partial English translation thereof.

(Continued)

*Primary Examiner* — Scott B Geyer
(74) *Attorney, Agent, or Firm* — McGinn IP Law Group, PLLC

(57) ABSTRACT

A mask layer is formed on a Ga polarity surface of the GaN substrate as a growth substrate. Subsequently, a protective film PF is formed on a N polarity surface of the GaN substrate. Then, a plurality of concave portions is formed from the mask layer extending to the GaN substrate, to thereby form a seed crystal. The seed crystal is etched in a Na melt, and a plurality of concave portions having a facet plane exposed. The seed crystal and the raw materials are placed in a crucible, and the pressure and temperature inside the crucible are increased. Thus, a target GaN layer is grown in the upward direction on the surface of the mask layer and the lateral direction over the concave portions.

18 Claims, 6 Drawing Sheets

(56) References Cited

U.S. PATENT DOCUMENTS

| | | |
|---|---|---|
| 2004/0147096 A1 | 7/2004 | Kitaoka et al. |
| 2004/0183090 A1 | 9/2004 | Kitaoka et al. |
| 2005/0059229 A1 | 3/2005 | Minemoto et al. |
| 2006/0027831 A1 | 2/2006 | Kioke et al. |
| 2007/0084399 A1* | 4/2007 | Sarayama et al. ............ 117/73 |
| 2011/0110840 A1* | 5/2011 | Miyanaga et al. ............ 423/409 |
| 2011/0155046 A1 | 6/2011 | Yamazaki |
| 2012/0085279 A1* | 4/2012 | Sarayama et al. ............ 117/223 |
| 2013/0199438 A1 | 8/2013 | Nagai et al. |

FOREIGN PATENT DOCUMENTS

| | | |
|---|---|---|
| CN | 1664179 A | 9/2005 |
| CN | 1954101 A | 4/2007 |
| CN | 101393958 A | 3/2009 |
| CN | 101432471 A | 5/2009 |
| CN | 101558187 A | 10/2009 |
| CN | 101925696 A | 12/2010 |
| EP | 1576210 B1 | 2/2010 |
| JP | 2005-012171 A | 1/2005 |
| JP | 2005-225681 A | 8/2005 |
| JP | 2006-131454 A | 5/2006 |
| JP | 2006-169024 A | 6/2006 |
| JP | 2008-150239 A | 7/2008 |
| JP | 2010-037153 A | 2/2010 |
| JP | 2010-171273 A | 8/2010 |
| JP | 2011-132110 A | 7/2011 |
| WO | WO 03/072856 A1 | 9/2003 |

OTHER PUBLICATIONS

Japanese Office Action for Japanese Patent Application No. 2012-062268 dated Jun. 3, 2014 with a partial English translation thereof.
Chinese Office Action dated Feb. 11, 2015 with an English translation thereof.
Specification, claims and Drawings for U.S. Appl. No. 14/295,204.
Japanese Office Action dated Aug. 6, 2014 with a partial English translation.
United States Office Action dated Aug. 19, 2014 in U.S. Appl. No. 12/926,995.
U.S. Office Action dated Aug. 12, 2015 in the co-pending U.S. Appl. No. 13/762,318.

* cited by examiner

METHOD FOR ETCHING A GROUP III NITRIDE SEMICONDUCTOR, METHOD FOR PRODUCING A GROUP III NITRIDE SEMICONDUCTOR CRYSTAL, AND METHOD FOR PRODUCING A GAN SUBSTRATE

BACKGROUND OF THE INVENTION

1. Field of the Invention

The present invention relates to a method for etching a Group III nitride semiconductor, to a method for producing a Group III nitride semiconductor crystal and to a method for producing a GaN substrate.

2. Background Art

A variety of methods for producing a semiconductor crystal are known, and examples thereof include vapor phase growth methods such as metalorganic chemical vapor deposition (MOCVD) and hydride vapor phase epitaxy (HVPE), molecular beam epitaxy (MBE), and liquid phase epitaxy (LPE). One technique of LPE is a flux method employing a Na flux.

In the flux method, a molten mixture of metallic Na (sodium) and metallic Ga (gallium) is reacted with nitrogen under pressure for the growth of a GaN crystal. This method is expected to produce an inexpensive and high-quality GaN substrate because GaN crystal can be grown at a comparatively low temperature (up to 1,000° C.) and low pressure (up to 10 MPa).

In the case where a GaN crystal is grown on an underlayer (GaN or AlN) serving as a seed crystal through a flux method, the crystal properties of the GaN crystal are inherited from those of the underlayer. That is, the dislocation density of the semiconductor crystal to be grown is inherited from that of the underlayer. Therefore, the dislocation density of the grown semiconductor crystal is about $5 \times 10^6/cm^2$ to $1 \times 10^7/cm^2$ as same order as that of the underlayer.

A smaller dislocation density for the grown semiconductor crystal is preferred. For example, a dislocation density of $1 \times 10^5/cm^2$ or less is preferred. Thus, in order to produce a GaN crystal having a smaller dislocation density, the dislocation density must be considerably reduced during the growth of a GaN crystal. Japanese Patent Application Laid-Open (kokai) No. 2005-12171 discloses an example of such method that a mask layer is formed on a seed crystal and GaN is laterally grown over the mask.

Japanese Patent Application Laid-Open (kokai) No. 2006-131454 (paragraph [0010]) discloses a technique for slightly growing a semiconductor crystal with the flux temperature kept at a lower temperature than the growth temperature of semiconductor crystal to be grown.

Japanese Patent Application Laid-Open (kokai) No. 2008-150239 discloses a technique for using GaN on a sapphire substrate as a template, forming a protective film on a rear surface of the sapphire substrate, and growing GaN through a flux method.

However, in the above Japanese Patent Application Laid-Open (kokai) Nos. 2005-12171, 2006-131454, and 2008-150239, the dislocation density of the GaN crystal is about $1 \times 10^6/cm^2$. Thus, in order to produce a GaN crystal having a smaller dislocation density, the dislocation density must be considerably reduced during the growth of a GaN crystal.

SUMMARY OF THE INVENTION

The present invention has been conceived in order to overcome the aforementioned drawbacks involved in conventional techniques. Thus, an object of the present invention is to provide an etching method having good reproducibility for the entire GaN growth surface, a method for producing a Group III nitride semiconductor crystal having excellent crystallinity, and a method for producing a GaN substrate.

In a first aspect of the present invention, there is provided a method for etching a Group III nitride semiconductor, the method comprising:

a protective film formation step of forming a protective film on a first surface being a N polarity surface of Group III nitride semiconductor; and an etching step of etching at least a portion of a second surface of Group III nitride semiconductor in a melt containing at least Na.

In the above method for etching a Group III nitride semiconductor, the second surface of Group III nitride semiconductor is etched in a melt containing Na in a crucible. Etching proceeds as the temperature increases. However, the first surface is not etched since a protective film is formed on the first surface of Group III nitride semiconductor. That is, etching of the second surface is promoted by the formation of the protective film. Here, when the Group III nitride semiconductor is GaN, the second surface is a Ga polarity surface.

A second aspect of the present invention is a specific embodiment of the method for etching a Group III nitride semiconductor of the first aspect, wherein, the etching method comprises a mask layer formation step of forming a mask layer made of $Al_XIn_YGa_{(1-X-Y)}N$ ($0 \leq X$, $0 \leq Y$, $X+Y \leq 1$) on a portion of the second layer of the Group III nitride semiconductor, and in the etching step, the second surface of the Group III nitride semiconductor is etched after the mask layer formation step.

A third aspect of the present invention is a specific embodiment of the method for etching a Group III nitride semiconductor of the second aspect, wherein the mask layer is formed of AlGaN.

A fourth aspect of the present invention is a specific embodiment of the method for etching a Group III nitride semiconductor of any of the first to third aspects, wherein the protective film is formed of at least one selected from a group consisting of $Al_2O_3$, $ZrO_2$, and $TiO_2$.

A fifth aspect of the present invention is a specific embodiment of the method for etching a Group III nitride semiconductor of any of the first to fourth aspects, wherein, in the etching step, the temperature of the melt containing at least Na is 600° C. to 1,000° C.

A sixth aspect of the present invention is a specific embodiment of the method for etching a Group III nitride semiconductor of any of the first to fifth aspects, wherein, in the etching step, the concentration of Group III metal in the melt containing at least Na is 0 mol % to 5 mol %.

In a seventh aspect of the present invention, there is provided a method for producing a Group III nitride semiconductor crystal, the method comprising:

a protective film formation step of forming a protective film on a first surface being a N polarity surface of Group III nitride semiconductor;

an etching step of etching at least a portion of a second surface of Group III nitride semiconductor in a melt containing at least Na, to thereby form a seed crystal; and a semiconductor crystal formation step of growing a target layer of Group III nitride semiconductor crystal on the seed crystal in a molten mixture containing at least Group III metal and Na.

An eighth aspect of the present invention is a specific embodiment of the method for producing a Group III nitride semiconductor crystal of the seventh aspect, wherein, the method further comprises a mask layer formation step of partially forming a mask layer made of $Al_XIn_YGa_{(1-X-Y)}N$ (0≤X, 0≤Y, X+Y≤1) on a second surface of Group III nitride semiconductor, to thereby form an unexposed portion of the second surface which is covered with the mask layer and the remaining portion of the second surface which is not covered with the mask layer, and in the etching step, the exposed portion of the second surface of the Group III nitride semiconductor is etched after the mask layer formation step.

A ninth aspect of the present invention is a specific embodiment of the method for producing a Group III nitride semiconductor crystal of the eighth aspect, wherein, the mask layer formation step further comprises a mask layer growth step of growing a uniform mask layer so as to cover the entire second surface of the underlayer formed of Group III nitride semiconductor, and a concave portion formation step of forming a plurality of concave portions in the underlayer by removing an area of the mask layer to expose a part of the underlayer.

In the above method for producing a Group III nitride semiconductor crystal, the first surface does not undergo melting back since the protective film is formed on the first surface being a N polarity surface. Instead, the second surface undergoes greater melting back. Thus, the concave portion has a sufficiently large depth. With the surface of the mask layer as a starting point, Group III nitride semiconductor crystal is formed. On the other hand, non-crystal portions composed of flux are formed on the concave portions. By virtue of such non-crystal portions, threading dislocations are not inherited from the underlayer by the formed semiconductor crystal.

A tenth aspect of the present invention is a specific embodiment of the method for producing a Group III nitride semiconductor crystal of the eighth or ninth aspect, wherein the mask layer is formed of AlGaN.

An eleventh aspect of the present invention is a specific embodiment of the method for producing a Group III nitride semiconductor crystal of any of the seventh to tenth aspects, wherein the protective film is formed of at least one selected from a group consisting of $Al_2O_3$, $ZrO_2$, and $TiO_2$.

A twelfth aspect of the present invention is a specific embodiment of the method for producing a Group III nitride semiconductor crystal of any of the seventh to eleventh aspects, wherein, in the etching step, a facet plane of the underlayer is exposed.

A thirteenth aspect of the present invention is a specific embodiment of the method for producing a Group III nitride semiconductor crystal of the twelfth aspect, wherein, in the semiconductor crystal formation step, Group III nitride semiconductor crystal is grown on the mask layer such that the facet plane is not buried with the Group III nitride semiconductor crystal.

A fourteenth aspect of the present invention is a specific embodiment of the method for producing a Group III nitride semiconductor crystal of the thirteenth aspect, wherein, in the semiconductor crystal formation step, a non-crystal portion defined by the facet plane and the bottom surface of the Group III nitride semiconductor crystal is formed.

A fifteenth aspect of the present invention is a specific embodiment of the method for producing a Group III nitride semiconductor crystal of any of the seventh to fourteenth aspects, wherein the mask layer is a Group III nitride semiconductor having an Al composition ratio of 0.02 to 1.00 since the Group III nitride semiconductor layer containing Al within this range is virtually undissolved in the flux.

A sixteenth aspect of the present invention is a specific embodiment of the method for producing a Group III nitride semiconductor crystal of any of the seventh to fifteenth aspects, wherein the underlayer is a Group III nitride semiconductor having an Al composition ratio of 0 to 0.02, and the Al composition ratio of the underlayer is smaller than that of the mask layer.

A seventeenth aspect of the present invention is a specific embodiment of the method for producing a Group III nitride semiconductor crystal of any of the seventh to sixteenth aspects, wherein, in the etching step, the temperature of the melt containing at least Na is 600° C. to 1,000° C.

In an eighteenth aspect of the present invention, there is provided a method for producing a GaN substrate, the method comprising:

a protective film of forming a protective film on a first surface being a N polarity surface of Group III nitride semiconductor;

an etching step of etching at least a portion of a second surface of Group III nitride semiconductor in a melt containing at least Na, to thereby form a seed crystal;

a semiconductor crystal formation step of growing a GaN crystal on the seed crystal in a molten mixture containing at least Ga and Na; and a semiconductor crystal separation step of separating the GaN crystal from the seed crystal.

The present invention can promote the etching of the second surface by forming the protective film on the first surface being a N polarity surface of Group III nitride semiconductor. This enables stable formation of deep concave portions having a depth of tens to hundreds μm. By using the seed crystal provided with deep concave portions, the inheritance of dislocations is blocked. Thus, a method for producing a Group III nitride semiconductor crystal having excellent crystallinity and a method for producing a GaN substrate are achieved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
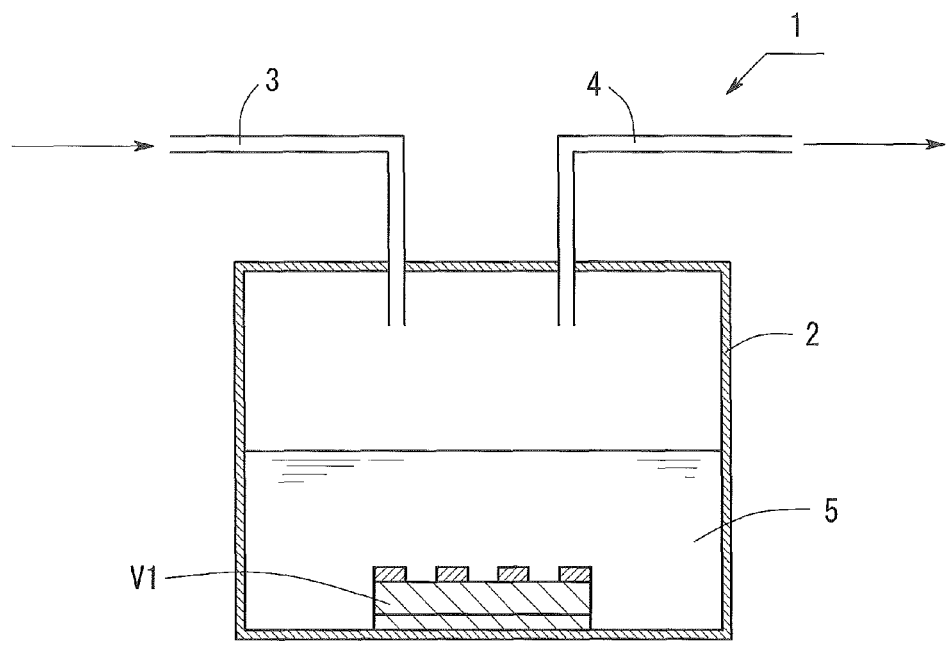
FIG. 1 is a sketch of an etching apparatus used for etching a Group III nitride semiconductor according to embodiments.

Hereinafter, specific embodiments of the present invention will be described with reference to the drawings. However, these embodiments are given only for the purpose of illustration and should not be construed as limiting the invention thereto. In the drawings, the thickness of each layer is not an actually measured one but a conceptual thickness.

Embodiments of a method for etching a Group III nitride semiconductor, a method for producing a Group III nitride semiconductor crystal using the same and a method for producing a GaN substrate using the same will be described. In Embodiment 1, a method for etching a Group III nitride semiconductor is described. In Embodiments 2 and 3, a method for producing a Group III nitride semiconductor crystal using the etching method of Embodiment 1 is described. In Embodiment 4, a method for producing a GaN substrate using the method for producing a Group III nitride semiconductor crystal of Embodiments 2 and 3 is described.

Embodiment 1

Embodiment 1 will be described. In Embodiment 1, a method for etching a Group III nitride semiconductor in a melt containing Na is described.

1. Etching Apparatus

FIG. 1 is a sketch of an etching apparatus 1 employed in a method for etching a Group III nitride semiconductor according to Embodiment 1. The etching apparatus 1 is an apparatus for etching a Group III nitride semiconductor V1. The etching apparatus 1 includes a chamber 2, a supply pipe 3, and a discharge pipe 4. The chamber 2 is a container that can contain an etching solution. The chamber 2 can also contain a Group III nitride semiconductor V1 to be etched and an etching solution 5.

The supply pipe 3 is to supply gas into the chamber 2. The discharge pipe 4 is to discharge gas from the chamber 2. Through operation of valves (not illustrated) attached to the supply pipe 3 and the discharge pipe 4, the inside of the chamber 2 is replaced with inert gas (e.g. $N_2$) or the pressure is controlled.

A semiconductor crystal production apparatus 10 (see FIG. 7) described in Embodiment 2 may be used other than the etching apparatus 1 shown in FIG. 1. Other etching apparatus may be used as long as it can contain the Group III nitride semiconductor V1 and the etching solution 5 in the container and adjust the temperature or pressure inside the container.

2. Group III Nitride Semiconductor (Etching Target)

Figure 2:
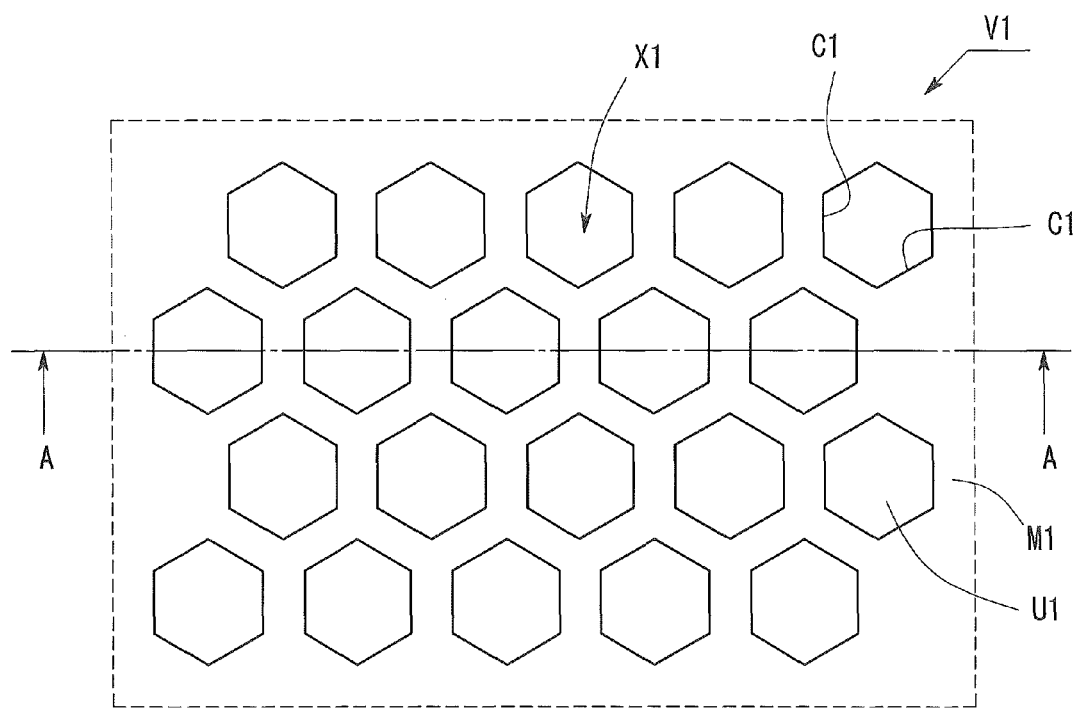
FIG. 2 is a plan view showing a Group III nitride semiconductor to be etched using the method for etching a Group III nitride semiconductor according to Embodiment 1.
Figure 3:
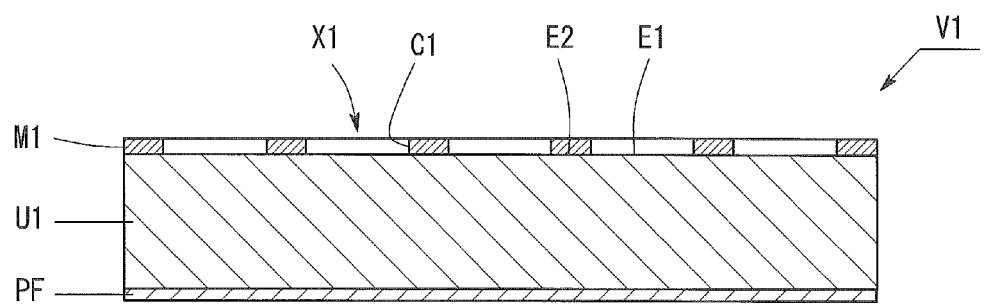
FIG. 3 shows an A-A cross-section of FIG. 2.

FIG. 2 shows a plan view of a Group III nitride semiconductor V1 to be etched as viewed from the top. FIG. 3 is an A-A cross-section of FIG. 2. The Group III nitride semiconductor V1 comprises an underlayer U1, a mask layer M1, and a protective film PF. A protective film PF is formed on a first surface of the underlayer U1 and a mask layer M1 is formed on a second surface of the underlayer U1. The underlayer U1 is made of GaN. The first surface of the underlayer U1 is a N polarity surface. That is, the protective film PF is formed on the N polarity surface of GaN. The second surface of the underlayer U1 is a Ga polarity surface, i.e., +c-plane (0001). The mask layer M1 is formed of a single crystal AlGaN. The mask layer M1 of AlGaN is epitaxially grown along the +c-axis of AlGaN on the second surface of the underlayer U1 of GaN through MOCVD and is etched in a predetermined pattern as shown in FIG. 2 by photolithography. Accordingly a top surface of AlGaN is a c-plane (Ga or Al polarity surface). The protective film PF is formed of $Al_2O_3$.

The mask layer M1 covers a portion of the second surface of the underlayer U1. Therefore, the underlayer U1 has exposed portions E1 which are not covered with the mask layer M1, and unexposed portions E2 which are covered with the mask layer M1. As shown in FIG. 2, the exposed portions E1 are hexagon shaped. The exposed portions E1 are disposed in a honeycomb structure. The side surface C1 of the mask layer M1 framing the exposed portions E1 is a surface perpendicular to a m-axis of GaN and AlGaN. That is, the side surface C1 is a m-plane of AlGaN.

Thus, a plurality of concave portions X1 is formed on the Group III nitride semiconductor V1. The concave portions X1 are disposed in a honeycomb structure and hexagon shaped. Each concave portion X1 has the exposed portion E1 of the underlayer.

The Al composition mol ratio (hereinafter, referred to as "composition ratio") X of the mask layer M1 is preferably 0.02 to 1.0. More preferably, the Al composition ratio X of the mask layer M1 is 0.03 to 0.50 as shown in Table 1. When the Al composition ratio X is less than 0.02, the mask layer M1 is rapidly dissolved by the etching solution 5. The Al composition ratio of the underlayer U1 is preferably 0 to 0.02. When the Al composition ratio is larger than 0.02, the underlayer U1 is difficult to etch. Needless to say, the Al composition ratio of the underlayer U1 is smaller than that of the mask layer M1 to remove the underlayer by etching.

Thus, a Group III nitride semiconductor V1 is prepared for etching of Embodiment 1. The Group III nitride semiconductor V1 has unexposed portions E2 of the underlayer U1 which are covered with the mask layer M1 and exposed portions E1, i.e., the remaining portion of the underlayer U1 which is not covered with the mask layer M1. That is, the underlayer U1 is partially covered with the mask layer M1.

TABLE 1

| Al composition ratio of mask layer | 0.03 to 0.50 |
|---|---|
| Thickness of mask layer | 2 nm to 2 μm |

3. Atomic Layer Deposition (ALD)

In Embodiment 1, a protective film PF is formed on a first surface of underlayer U1 through atomic layer deposition (ALD). ALD is superior in reproducibility of film quality and film thickness. The protective film PF is formed of, for example, $Al_2O_3$. At this time, the protective film PF is hardly dissolved even if subjected to etching. The thickness of the protective film PF is 10 nm to 200 nm. A well-known apparatus may be used in atomic layer deposition.

4. Etching Method

The etching method will next be described. In the etching method of Embodiment 1, a Group III nitride semiconductor V1 is etched in an etching solution 5. The Group III nitride semiconductor V1 and the etching solution 5 are placed in the chamber 2 of the above mentioned etching apparatus 1. Here, the etching solution 5 is a melt containing at least sodium (Na).

Table 2 shows the inside temperature and pressure conditions of the chamber 2 for etching. The melt may contain carbon (C) a little. Table 2 also shows the carbon content. Evaporation of the melt can be prevented by applying pressure inside the chamber 2. The etching time is 0.5 hours to 10 hour, which is only a guide. The gas supplied is Ar or $N_2$. The etching temperature is 600° C. to 1,000° C.

In the etching method of Embodiment 1, the mask layer M1 and the protective film PF are hardly dissolved and the underlayer U1 is dissolved. That is, the second surface of the underlayer U1, more specifically, the exposed portions E1 which are not covered with the mask layer M1, are etched. On the other hand, the AlGaN layer is hardly dissolved in the Na melt. However, actually, the mask layer M1 is slightly etched from the side surface C1. The amount of such side etching is larger at a higher temperature. Therefore, the temperature of the Na melt is preferably 830° C. or less. Within this temperature range, the etching rate of the N polarity surface is larger than that of the Ga polarity surface. However, in Embodiment 1, only Ga polarity surface can be etched since the protective film is formed on the N polarity surface.

More preferably, the temperature of the Na melt is 700° C. to 830° C. When etching is performed within this temperature range, a smoother facet plane is exposed. The etching rate of GaN increases by adding carbon. However, the etching rate of the N polarity surface also drastically increases by adding carbon. In Embodiment 1, only the Ga polarity surface can be etched since the protective film is formed on the N polarity surface. This is because the solubility of GaN in the Na melt containing a carbon content shown in Table 2 is higher than the solubility of GaN in the Na melt containing no carbon.

TABLE 2

| Temperature | 600° C. or more | 1,000° C. or less |
|---|---|---|
| Temperature (more preferable) | 700° C. or more | 830° C. or less |
| Pressure | 1 MPa or more | 10 MPa or less |
| Carbon content | 0 mol % or more | 1 mol % or less |

5. Group III Nitride Semiconductor after Etching

Figure 4:
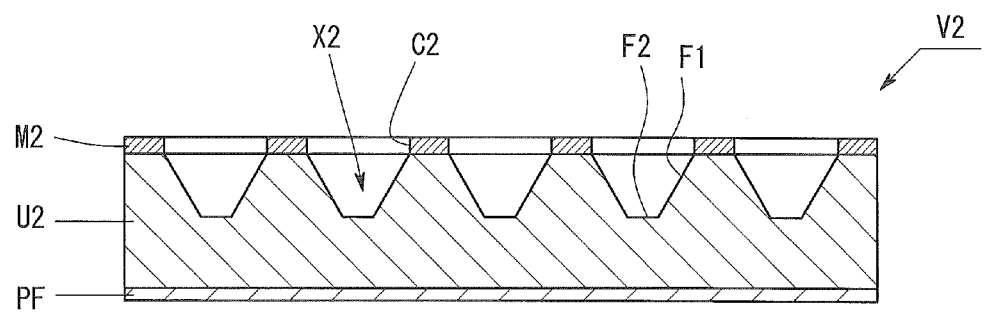
FIG. 4 is a cross-section of the Group III nitride semiconductor etched by the method for etching a Group III nitride semiconductor according to Embodiment 1.

FIG. 4 is a sketch of Group III nitride semiconductor V2 etched by the etching method of Embodiment 1. As shown in FIG. 4, concave portions X2 are formed on the Group III nitride semiconductor V2, which are deeper than before etching. A facet plane can be exposed in the concave portions X2. For example, the surface F1 is a {10-11} plane. The surface F2 is a {0001} plane. However, the Group III nitride semiconductor V2 can be etched until the {0001} plane disappears.

When the facet plane is exposed in this way, the dissolution rate of the exposed facet plane is sufficiently slow. Therefore, once the facet plane is exposed during etching, it hardly disappears even if etching continues after that. Usually once the facet plane is formed, the etching rate of the Ga polarity surface is reduced, and the N polarity surface etching is remarkable. However, in Embodiment 1, the N polarity surface is prevented from dissolving and the Ga polarity surface etching is never stopped during the process since the protective film PF is formed on the N polarity surface. The etching depth can be controlled by the width of opening and the etching time. For example, etching to a depth of about 300 μm is possible.

6. Variation

6-1. When the Mask Layer is not Formed

Figure 5:
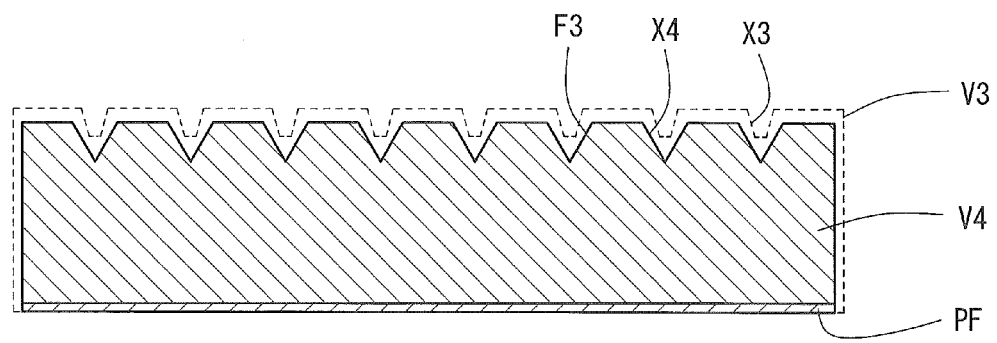
FIG. 5 is a cross-section of the Group III nitride semiconductor etched by the method for etching a Group III nitride semiconductor according to Embodiment 1.

In Embodiment 1, the mask layer M1 is formed on the Group III nitride semiconductor V1. However, even when the mask layer M1 is not necessarily formed, etching is possible. For example, as shown in FIG. 5, a Group III nitride semiconductor V4 (shown by the actual line of FIG. 5) having concave portions X4 can be produced by etching a Group III nitride semiconductor V3 (shown by the dotted line of FIG. 5) having concave portions X3 and no mask layer. Here, a facet plane F3 can be exposed in the concave portion X4. The melt temperature at that time may be the same as that shown in Table 2. Thus, the Group III nitride semiconductor can be etched. FIG. 5 is only a sketch. In FIG. 5, the protective film PF seems to be etched, but actually it is hardly etched.

6-2. Shape of Concave Portion of Group III Nitride Semiconductor

Figure 6:
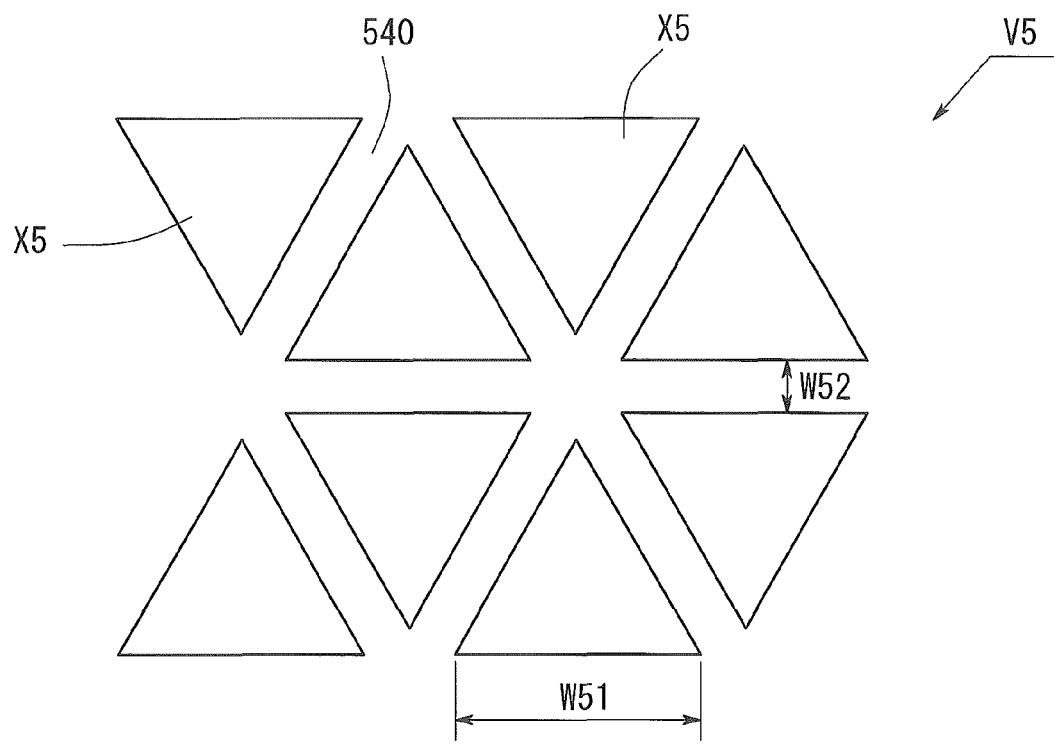
FIG. 6 is a plan view of a Group III nitride semiconductor to be etched by a method for etching a Group III nitride semiconductor according to variation of Embodiment 1.

In Embodiment 1, in a plan view hexagonal concave portions X1 are formed. However, the concave portion X1 may be another polygon or a circle in a plan view. For example, as shown in FIG. 6, triangle concave portions X5 may be formed. The concave portion X5 has a truncated triangular pyramid shape or a triangle prism shape. Each side length W51 of the triangle is 10 μm to 2,000 μm. The width W52 of the mask layer 540 is 10 μm to 200 μm. However, they are not limited to these values.

In the Group III nitride semiconductor V1 shown in FIG. 3, the second surface of the underlayer U1 is flat. That is, the exposed portions E1 and the unexposed portions E2 are on the same flat surface. However, the exposed portions E1 may be further removed. This case will be explained in Embodiment 2.

6-3. Etching Solution

In Embodiment 1, a melt containing Na is used as the etching solution 5. The etching solution 5 may contain Ga in addition to Na. In this case, the Ga content is preferably 5 mol % or less. When the Ga content exceeds 5 mol %, N dissolution from the vapor phase increases and the etching rate is reduced. Therefore, even if GaN is dissolved from the underlayer U1, the Ga content of the molten mixture must be 5 mol % or less. Thus, the Na amount of the etching solution is adjusted, considering the dissolution amount of Ga. The etching solution 5 may contain other Group III nitride metal.

6-4. Material of Underlayer

In Embodiment 1, a GaN layer is formed as the underlayer U1. However, a Group III nitride semiconductor having an Al composition ratio of 0 to 0.02 may be formed as the underlayer U1. The smaller the Al composition ratio, the easier the dissolution of the underlayer by etching. The Al composition ratio of the underlayer U1 is smaller than that of the mask layer M1 to appropriately dissolve the underlayer U1.

6-5. Material of Protective Film

In Embodiment 1, the protective film PF is formed of $Al_2O_3$ through atomic layer deposition (ALD). However, other material may be employed as long as it is not dissolved in the etching solution through etching. For example, silicon oxide, silicon nitride, titan oxide ($TiO_2$) or zirconium oxide ($ZrO_2$) may be employed. In addition, a metal having high melting point may be employed.

7. Summary of Embodiment 1

As described above, a Group III nitride semiconductor V1 having an underlayer U1, a mask layer M1, and a protective film PF is etched in a Na melt in the method for etching a Group III nitride semiconductor of Embodiment 1. Therefore, exposed portions E1 of the concave portions X1 are sufficiently etched, to thereby form concave portions X2 in which facet planes are exposed. Moreover, this etching method enables the formation of concave portions having a depth of hundreds μm or more.

Notably, Embodiment 1 is given for the purpose of illustration only, and needless to say, those skilled in the art can conceive various modifications and variations, so long as the scope of the invention is not impaired. The number of concave portions provided in the Group III nitride semiconductor V1 is actually a larger number, as compared with the number of concave portions illustrated in the drawings.

Embodiment 2

Embodiment 2 will be described. Embodiment 2 is directed to a method for producing a Group III nitride in which a Group III nitride semiconductor crystal is grown on a GaN self-standing substrate using the method for etching a Group III nitride semiconductor described in Embodiment 1.

1. Semiconductor Crystal Production Apparatus

Figure 7:
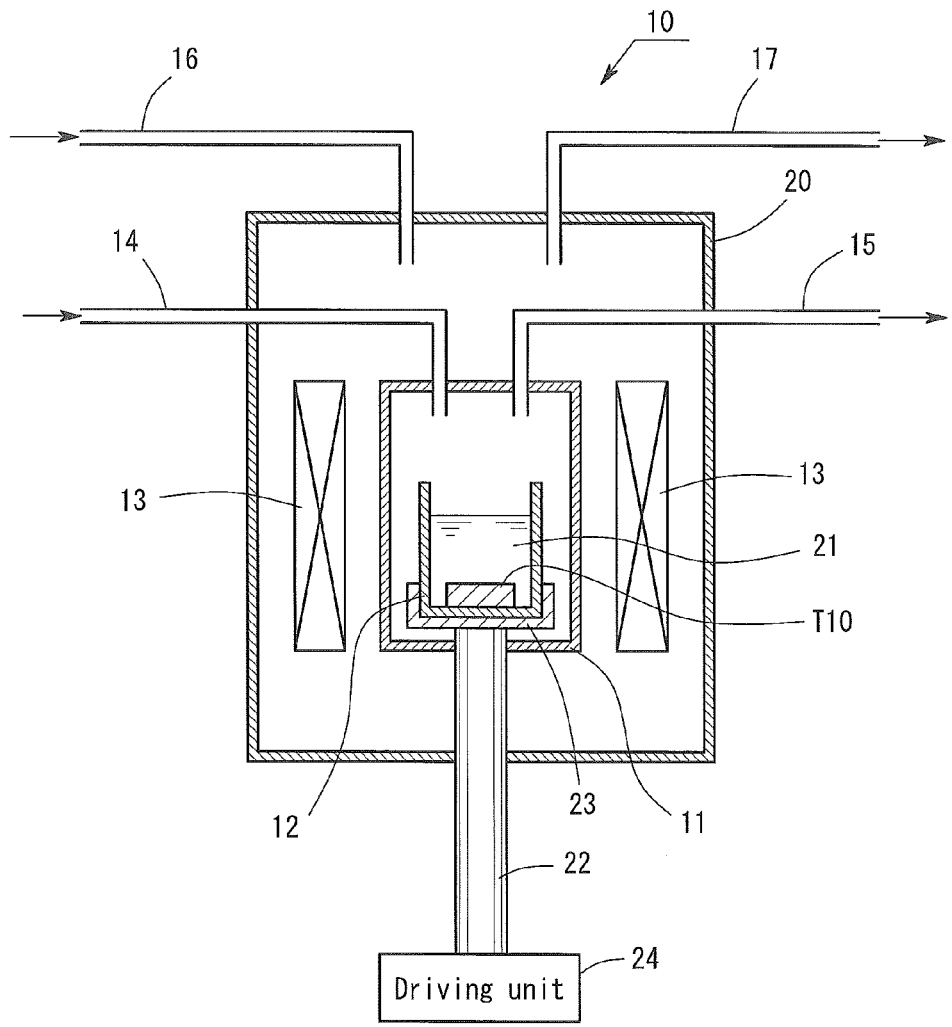
FIG. 7 is a sketch of a semiconductor crystal production apparatus employed in a method for producing a Group III nitride semiconductor crystal according to Embodiment 2.

The configuration of the production apparatus for the GaN crystal of Embodiment 2 will be described. As shown in FIG. 7, the semiconductor crystal production apparatus 10 includes a pressure container 20, a reaction vessel 11, a crucible 12, a heating apparatus 13, supply pipes 14, 16, and discharge pipes 15, 17.

The pressure container 20 is a pressure-resistant hollow cylinder made of stainless steel. To the pressure container 20, the supply pipe 16 and the discharge pipe 17 are connected. In the pressure container 20, the reaction vessel 11 and the heating apparatus 13 are disposed. Through placing the reaction vessel 11 in the pressure container 20, the reaction vessel 11 does not require particularly high pressure resistance. Thus, the reaction vessel 11 may be made of an inexpensive material, and recyclability is improved.

The reaction vessel 11 is made of SUS and has heat resistance. In the reaction vessel 11, the crucible 12 is placed. The crucible 12 is made of a material such as W (tungsten), Mo (molybdenum), BN (boron nitride), alumina, or YAG (yttrium aluminum garnet). The crucible 12 holds a molten mixture 21 containing Ga and Na, and a seed crystal T10 is maintained in the molten mixture 21.

To the reaction vessel 11, the supply pipe 14 and the discharge pipe 15 are connected. Through operation of valves (not illustrated) attached to the supply pipe 14 and the discharge pipe 15, there are performed aeration in and feeding nitrogen into the reaction vessel 11, and controlling the pressure inside the reaction vessel 11. Nitrogen is also supplied to the pressure container 20 via the supply pipe 16. Through operation of valves (not illustrated) attached to the supply pipe 16 and the discharge pipe 17, the nitrogen flow rate and discharge rate are controlled, thereby the pressure inside the pressure container 20 is virtually equalized with that of the reaction vessel 11. The temperature inside the reaction vessel 11 is controlled by means of the heating apparatus 13.

There is provided an apparatus which can rotate the crucible 12 so as to stir the molten mixture 21 contained in the crucible 12, thereby the molten mixture 21 is stirred during the growth of a GaN crystal. By virtue of the apparatus, the molten mixture 21 can have a uniform Na, Ga, or N concentration distribution profile, thereby a GaN crystal of uniform quality can be grown. The apparatus which can rotate the crucible 12 has a rotation axis 22, a table 23, and a driving unit 24. The rotation axis 22 extends from the inside of the reaction vessel 11 to the outside of the pressure container 20. The table 23 is disposed in the reaction vessel 11 and is connected to the rotation axis 22 so that it sustains the crucible 12. The driving unit 24 controls rotation of the rotation axis 22. The table 23 is rotated through rotation of the rotation axis 22 driven by the driving unit 24, thereby the crucible 12 sustained by the table 23 is rotated.

Meanwhile, when the employed reaction vessel 11 has pressure resistance, the pressure container 20 is not necessarily employed. In addition, in order to prevent vaporization of Na during growth of a GaN crystal, the crucible 12 may be provided with a lid. Instead of or in addition to the crucible 12 rotating means, crucible 12 swinging means may be provided.

2. Method for Producing a Group III Nitride Semiconductor Crystal

The method of Embodiment 2 for producing a Group III nitride semiconductor crystal includes the following steps:
(A) Seed crystal preparation step,
(A-1) Mask layer growth step,
(A-2) Protective film formation step,
(A-3) Concave portion formation step,
(B) Seed crystal etching step, and
(C) Semiconductor crystal formation step.
These steps will next be described in detail.

2-1. (A) Seed Crystal Preparation Step 2-1-1. (A-1) Mask Layer Growth Step

Figure 8:
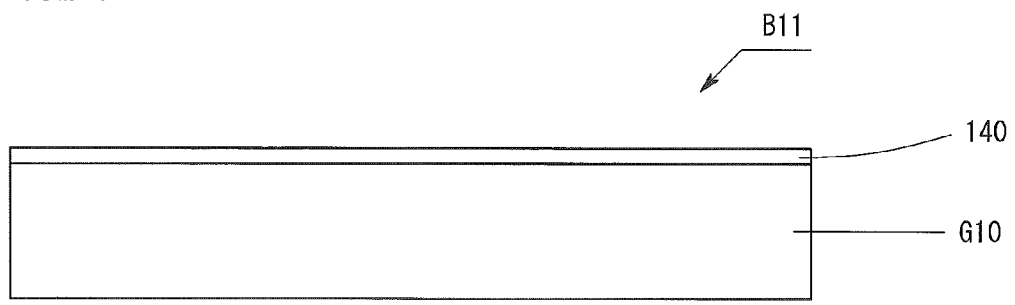
FIG. 8 is a sketch for describing a seed crystal preparation step employed in the method for producing a Group III nitride semiconductor crystal according to Embodiment 2.

Firstly, a GaN substrate G10 is provided. The GaN substrate G10 is a self-standing GaN substrate and has a dislocation density of about $5 \times 10^6/cm^2$. The GaN substrate G10 also serves as an underlayer on which a mask layer is to be formed. Thus, a mask layer 140 is formed on the GaN substrate G10. Eventually, a stacked body B11 shown in FIG. 8 is produced.

The mask layer 140 has a composition of $Al_X In_Y Ga_{(1-X-Y)}N$ ($0 \leq X$, $0 \leq Y$, $X+Y \leq 1$). The mask layer 140 is preferably an AlGaN layer. The Al composition ratio X of the mask layer 140 is preferably 0.02 to 1.0. Particularly, the Al composition ratio X of the mask layer 140 is more preferably 0.03 to 0.50, as shown in Table 1. When the Al composition ratio X is less than 0.03, the mask layer is readily melted back by a flux, whereas when the Al composition ratio X is more than 0.50, the quality of the GaN crystal formed in the below-described semiconductor crystal formation step may be adversely affected.

As shown in Table 1, the mask layer 140 preferably has a thickness of 2 nm to 2 μm. When the thickness of the mask layer 140 is less than 2 nm, the effect of melting back is not sufficient, whereas when the thickness of the mask layer 140 is in excess of 2 μm, the quality of the GaN crystal formed in the below-described semiconductor crystal formation step is impaired. In this mask layer growth step, the entire second surface of the underlayer U1 is uniformly covered with the mask layer 140. The mask layer 140 is formed by epitaxially growing AlInGaN on the GaN substrate G10 through MOCVD.

2-1-2. (A-2) Protective Film Formation Step

In Embodiment 2, a protective film PF is formed on the stacked body B11 through atomic layer deposition (ALD). The apparatus and method employed in Embodiment 2, are the same as in Embodiment 1. However, Embodiment 2 has a semiconductor crystal formation step as a latter step in addition to the etching step. Therefore, in the semiconductor crystal formation step, the protective film PF must not be dissolved. The materials listed in Embodiment 1 and Variation of Embodiment 1 may be used as the material of the protective film PF. By virtue of this step, the protective film PF is formed on the first surface of the stacked body B11, and eventually a stacked body B12 is produced.

Figure 9:
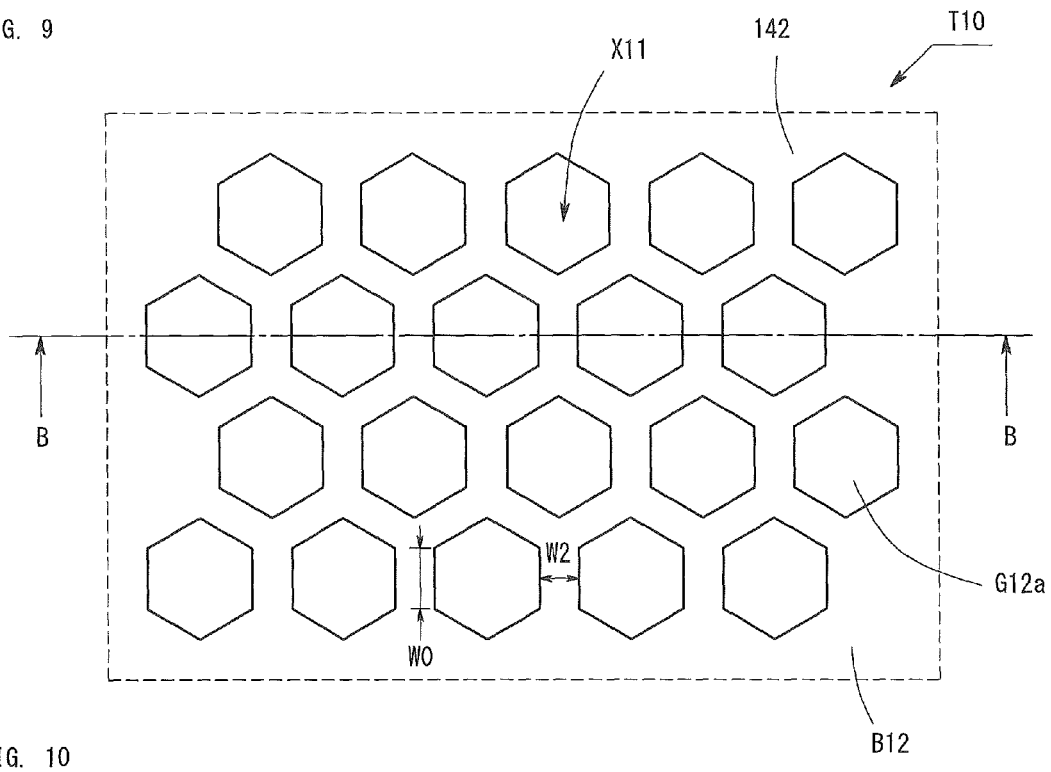
FIG. 9 is a sketch (part 1) for describing a seed crystal employed in the method for producing a Group III nitride semiconductor crystal according to Embodiment 2.
Figure 10:
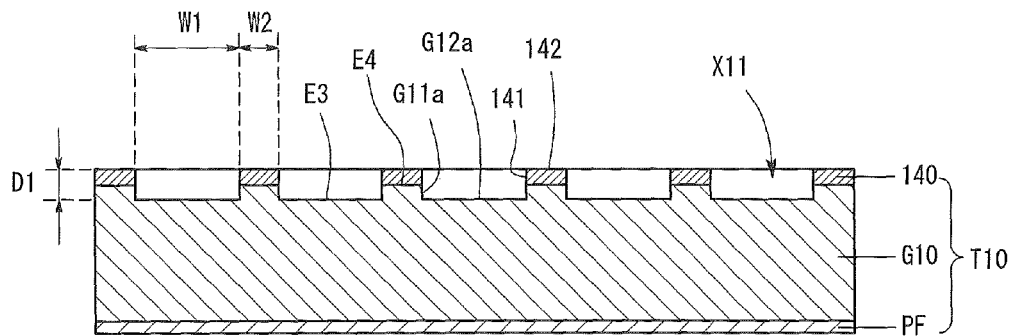
FIG. 10 is a sketch (part 2) for describing a seed crystal employed in the method for producing a Group III nitride semiconductor crystal according to Embodiment 2.

2-1-3. (A-3) Concave Portion Formation Step 2-1-3-1. Concave Portion Formation Procedure Then, a plurality of concave portions X11 is formed in the stacked body B11 having the protective film PF on a back surface thereof, which is defined as a stacked body B12 shown in FIG. 9. FIG. 10 shows a B-B cross-section of FIG. 9. As shown in FIG. 10, a plurality of concave portions X11 are formed by removing an area of the mask layer 140 through the full thickness and the corresponding area of the GaN substrate G10 through a partial thickness. In each concave portion X11, the GaN substrate G10 is exposed. Through the above procedure, as shown in FIGS. 9 and 10, a seed crystal T10 having a plurality of concave portions X11 is produced. The concave portions X11 may be formed through, for example, photolithography. Firstly, patterning of resist is performed. Then, an area of the mask layer 140 through the full thickness and the corresponding area of the GaN substrate G10 through a partial thickness are removed through dry etching, to thereby form a plurality of concave portions X11. After formation of the concave portions X11, the mask layer 140 serves as a mask portion which covers the underlayer. Subsequently, the resist mask is removed, thereby the seed crystal T10 shown in FIGS. 9 and 10 is produced. Then, the seed crystal T10 shown in FIGS. 9 and 10 is produced. Then, the seed crystal T10 provided with a plurality of a plurality of concave portions X11 is washed.

2-1-3-2. Seed Crystal Provided with Concave Portions

The seed crystal T10 includes a GaN substrate G10, a protective film PF, and a mask layer 140. While the protective film PF is formed on the first surface of the GaN substrate G10, the mask layer 140 is formed on the second surface of the GaN substrate G10. As shown in FIG. 9, the concave portions X11 are disposed in a honeycomb structure on the surface 142 of the mask layer 140. As viewed from the top of the mask layer 140, each concave portion X11 of the seed crystal T10 has a hexagon shape.

As shown in FIG. 10, each concave portion X11 is a non-through hole which passes through the mask layer 140 through the full thickness and removes the corresponding area of the GaN substrate G10 through a partial thickness. While the mask layer 140 has a thickness of 2 nm to 2 μm, each concave portion X11 has a depth D1 which is larger than the thickness of the mask layer 140. The depth D1 of the concave portion X11 is 1 μm to 5 μm. In the case of formation of the concave portions X11, one requirement is that a part of the GaN substrate G10 (i.e., GaN layer) is exposed to the bottom surface of each concave portion X11.

In each concave portion X11, each side of hexagon W0 (see FIG. 9) has a length of 10 μm to 2,000 μm. When the side length W0 is shorter than 10 μm, the effect of dislocation reduction is not sufficiently obtained.

The spacing between two adjacent concave portions X11 (W2) is 10 μm to 200 μm. The spacing W2 is less than 10 μm, the area of the surfaces 142, which serve as starting points of lateral growth of a semiconductor layers grown in the below-described semiconductor crystal formation step, is difficult to secure.

Each concave portion X11 has a bottom surface G12a and side surfaces G11a, 141. The bottom surface G12a is a part of the GaN substrate G10. The side surfaces G11a, 141 are generally orthogonal to the surface 142 of the mask layer 140. The side surfaces G11a, 141 are formed to pass through the mask layer 140 through the full thickness and the GaN substrate G10 through a partial thickness. As shown in FIG. 10, the seed crystal T10 has an unexposed portion E4 of the GaN substrate G10, which is covered with the mask layer 140, and an exposed portion E3, i.e., the remaining portion of the GaN substrate G10, which is not covered with the mask layer 140.

2-2. (B) Seed Crystal Etching Step

Then, the seed crystal T10 is etched through the etching method described in Embodiment 1. That is, the seed crystal T10 and the etching solution 5 are placed in the chamber 2 of the etching apparatus 1. Under the conditions shown in Table 2, etching is performed. The etching solution 5 has a Ga concentration of 5 mol %.

During the above step, portions of the GaN substrate G10, which have been provided to serve as side surfaces of the concave portions X11, are dissolved in the etching solution 5. Specifically, the bottom surfaces G12a and the side surfaces G11a are dissolved in the etching solution 5. On the contrary, the mask layer 140 is difficult to dissolve in the etching solution 5. However, since the GaN substrate G10, serving as an underlayer with respect to the mask layer 140, is dissolved, the mask layer 140 is slowly dissolved on the lateral side. Thus, the dimensions of each concave portion X11 increase. More specifically, the depth of the concave portion X11 increases, and the width thereof increases slightly.

The etching of GaN substrate G10 does not occur on the first surface side of the GaN substrate G10, i.e., the protective film PF side, since the GaN substrate G10 is not exposed on the protective film PF side. The exposed portions E3 are subjected to etching on the second surface side of the GaN substrate G10, i.e., the mask layer 140 side. Thus, the seed crystal T10 is etched, and the facet plane of the GaN substrate G10 is formed, to thereby yield a seed crystal T11 shown in FIG. 11.

Figure 11:
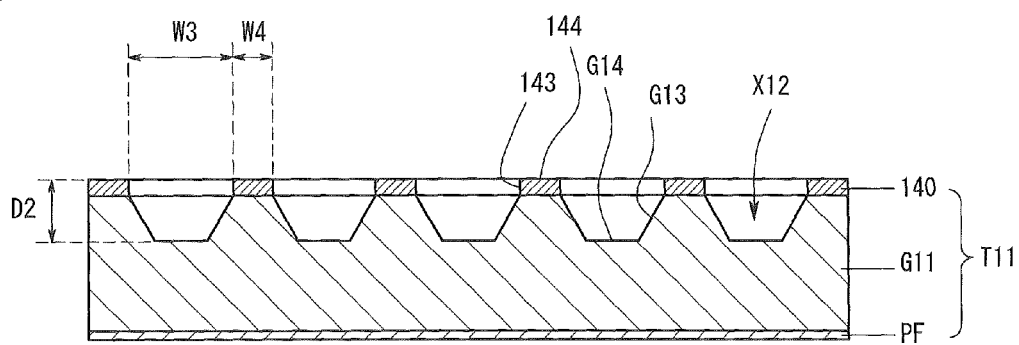
FIG. 11 is a sketch for describing the method for producing a Group III nitride semiconductor crystal according to Embodiment 2.

The concave portions X11 are subjected to etching, to provide concave portions X12 shown in FIG. 11. Each concave portion X12 has inclined planes G13, a bottom surface G14, and side surfaces 143. The inclined plane G13 corresponds to a (10-11) plane. The bottom surface G14 corresponds to a {0001} plane. Thus, facet planes are exposed in the concave portion X12. However, the inclined plane G13 is not necessarily a complete {10-11} plane. It may be a collective surface of small {10-11} planes, i.e., terraces of {10-11}. Similarly, the bottom surface G14 may not be necessarily a complete {0001} plane.

2-3. (C) Semiconductor Crystal Formation Step

Subsequently, a semiconductor crystal layer is formed on the seed crystal T11 through a flux method, which is a technique of liquid phase epitaxy. That is, the seed crystal T11 and the raw materials are placed in the semiconductor production apparatus 10. Table 3 shows the raw materials (flux) employed herein. The Ga ratio is preferably 5 mol % to 40 mol %. The carbon ratio may be varied from 0 mol % to 2.0 mol %. That is, the flux may or may not contain carbon, and preferably has a carbon content of 0.01 mol % to 2.0 mol %. Notably, the amounts of the elements shown in Table 3 are merely examples, and other amounts may be employed.

Needless to say, the target semiconductor crystal is a Group III nitride semiconductor crystal, which may be GaN, AlGaN, InGaN, AlInGaN, etc. Firstly, the raw materials shown in Table 3 are weighed in a glovebox in which dew point and oxygen level are controlled. Notably, the amounts of the raw materials shown in Table 3 are merely examples, and other amounts may be employed. Then, the seed crystal T11 and the raw materials are placed in a crucible 12 made of alumina. Next, the crucible 12 is placed on a turn-table 23 disposed in the reaction vessel 11 in the semiconductor crystal production apparatus 10. The pressure container 20 is evacuated, and the pressure and temperature inside the container 20 are elevated. At this time, nitrogen gas as one of the raw materials is supplied inside the reaction vessel 11.

TABLE 3

| Ga | 20 g to 80 g |
|---|---|
| Na | 20 g to 80 g |
| C | 0.01 mol % to 2.0 mol % (based on Na) |

Table 4 shows the conditions employed in the above step and in the crucible. Actually, the temperature is 870° C., and the pressure is 4 MPa. Under these conditions, the aforementioned materials are melted to form a molten mixture. The mixture is stirred at 20 rpm. The direction of the rotation of the turn-table 23 is appropriately altered in a predetermined period. At this time, melting back of the seed crystal T11 hardly occurs since the facet planes have been exposed in the seed crystal T11, and the seed crystal T11 is difficult to dissolve in the molten mixture. Thereby, a semiconductor crystal is grown on the seed crystal T11. The growth time is 30 hours.

TABLE 4

| Temperature | 850° C. to 1,000° C. |
|---|---|
| Pressure | 3 MPa to 10 MPa |
| Stirring condition | 0 rpm to 100 rpm |
| Growth time | 20 to 200 hours |

Figure 12:
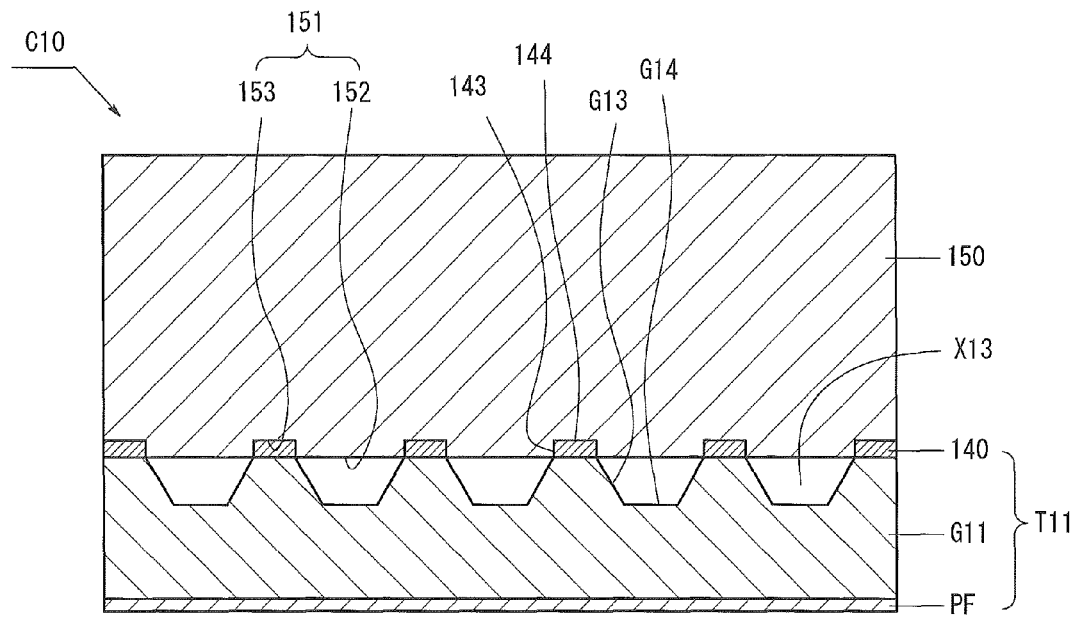
FIG. 12 is a sketch (part 1) for describing a Group III nitride semiconductor crystal according to Embodiment 2.

After the flux has been saturated through pressurization, a GaN layer 150 is grown on the seed crystal T11 in the molten mixture. At this time, the GaN layer 150 grows on the mask layer 140. That is, the GaN layer 150 grows from the surface 144 of the mask layer 140 in the upward (vertical) direction and the lateral direction over the concave portions X12. On the other hand, GaN hardly grows on the inclined plane G13, the bottom surface G14, the side surface 143. The reason for this is that the growth rate of the semiconductor layer on the facet plane is extremely slow, and nitrogen (N) is difficult to supply to the concave portion X12. Therefore, as shown in FIG. 12, the GaN layer 150 is grown such that the facet plane of the concave portion X12 is not buried with the Group III nitride semiconductor.

3. Produced Group III Nitride Semiconductor Crystal 3-1. GaN Crystal

As described above, a GaN crystal C10 as shown in FIG. 12 is produced through the method for producing a Group III nitride semiconductor crystal of Embodiment 2. The GaN crystal C10 has the GaN substrate G11, the mask layer 140, the GaN layer 150, non-crystal portions X13, and the protective film PF. The GaN layer 150 is a GaN single crystal.

Non-crystal portions X13 are portions in which no semiconductor crystal has been formed. Each non-crystal portion X13 assumes a space. However, actually, the space is filed with a flux. Each non-crystal portion X13 is defined by the inclined planes G13 (110-111 plane) of the GaN substrate G11 and a portion 152 of the bottom surface 151 of the GaN layer 150.

3-2. Shape of Crystal

The bottom surface 151 of the GaN layer 150 is in contact with the mask layer 140 and the non-crystal portions X13. Portions 152 of the bottom surface 151 of the GaN layer 150 are in contact with the non-crystal portions X13. Each of the portions 152 of the bottom surface 151 of the GaN layer 150 which is in contact with the non-crystal portion X13 generally assumes the form of a hexagon as viewed from the top. The remaining portions 153 of the bottom surface 151 of the GaN layer 150 are in contact with the mask layer 140. The bottom surface 151 of the GaN layer 150 is flat with a step of a thickness of the mask layer 140. As described in the Examples hereinbelow, the thickness of the GaN layer 150 may be adjusted to about 1 mm.

3-3. Dislocation Density of Crystal

The GaN crystal B12 of Embodiment 2 has non-crystal portions X13. Therefore, during the growth of the GaN layer 150 from the GaN substrate G10, dislocations do not extend from the portions 152 of the bottom surface 151 of the GaN layer 150. In other words, some dislocations are not inherited from the underlayer by the GaN substrate. However, dislocations are inherited from the mask layer 140. Thus, since inheritance of dislocations from the underlayer is partially inhibited, the GaN layer 150 has excellent crystallinity. Specifically, the GaN layer 150 has an average dislocation density of the whole surface of $1 \times 10^5/cm^2$ or less.

3-4. Separability of Crystal

Figure 13:
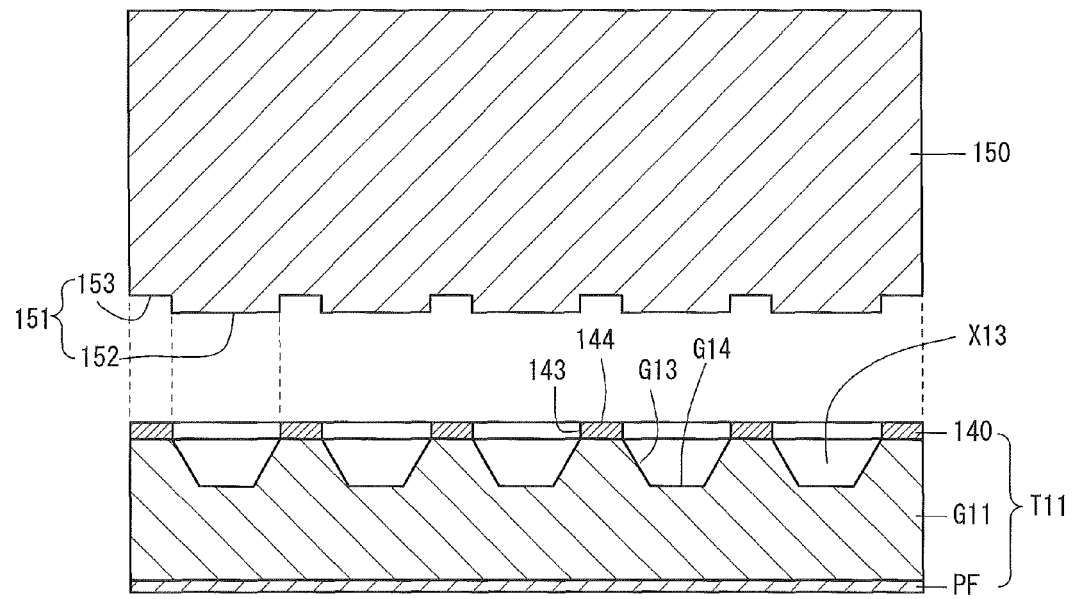
FIG. 13 is a sketch (part 2) for describing a Group III nitride semiconductor crystal according to Embodiment 2.

Regarding the GaN crystal B12 of Embodiment 2, the GaN layer 150 can be readily separated from the GaN substrate G10, since the stress attributed to warpage of the seed crystal or the like is applied mainly to the interface between the seed crystal T11 and the GaN layer 150. In some cases, the seed crystal is spontaneously removed from the crystal at the time of temperature lowering performed during crystal growth. Alternatively, by applying slight impact to the stacked body after crystal growth, the seed crystal may be removed from the crystal. FIG. 13 shows the GaN layer 150 and the seed crystal T11 after separation. Thus, the GaN layer 150 is readily removed from the GaN substrate G11, by virtue of non-crystal portions X13 provided between the growth substrate and the GaN layer 150.

As described above, concave portions X11 and non-crystal portions X13 are intentionally provided in order to intercept inheritance of dislocations, thereby a Group III nitride semiconductor crystal which has excellent crystallinity and which can be readily separated from the growth substrate can be produced.

4. Variation

4-1. Group III Nitride Semiconductor Crystal

In Embodiment 2, a GaN layer 150 is formed. However, the method of the invention may be applied to production of other Group III nitride semiconductor crystals than GaN. That is, the production method of the invention is applicable to production of $Al_XIn_YGa_{(1-X-Y)}N$ ($0 \leq X$, $0 \leq Y$, $X+Y \leq 1$).

4-2. Seed Crystal Etching Step and Semiconductor Crystal Formation Step

In Embodiment 2, the seed crystal etching step and the semiconductor crystal formation step are performed separately using a different apparatus. Actually, the seed crystal etching step and the semiconductor crystal formation step may be sequentially performed in the semiconductor crystal production apparatus 10. In that case, these sequential steps can be performed by using the etching solution 5 containing Ga or adding only Ga to the etching solution 5 after the seed crystal etching step.

4-3. Seed Crystal Preparation Procedure

In Embodiment 2, as the seed crystal preparation step, the mask layer growth step, the protective film formation step, and the concave portion formation step are performed in this order. However, these steps may be performed in the rearranged order. In this case, the concave portion formation step is performed after the mask layer growth step. Therefore, for example, the mask layer growth step, the concave formation step, and the protective film formation step may be performed in this order.

4-4. Shape of Concave Portion

In Embodiment 2, the seed crystal T10 having hexagonal concave portions X11 is employed. The plane shape of the concave portion X11 may be another polygon such as hexagon, or a circle. The concave portion preferably has a plane for which a facet plane of the GaN substrate G10 is easy to expose through Na etching.

4-5. Material of Protective Film

In Embodiment 2, the protective film PF is formed of $Al_2O_3$ through atomic layer deposition (ALD). However, other material may be employed as long as it is not dissolved in the etching solution through etching.

Here, when a silicon compound is employed as the material of the protective film PF, the silicon compound is dissolved in flux, to thereby inhibit the growth of GaN crystal. Therefore, a material containing Si such as $SiO_2$ is not preferable. However, if $SiO_2$ is removed after the seed crystal etching step, GaN crystal can be grown.

5. Summary of Embodiment 2

As described above, a seed crystal having the protective film PF on the first surface and the mask layer 140 on the second surface is used as the seed crystal T10 for the flux method in the method for producing a Group III nitride semiconductor crystal according to Embodiment 2. The second surface is provided with the concave portions X11. A semiconductor crystal is grown on the mask layer 140. Therefore, no semiconductor crystal is formed in each concave portion X12, and instead, the concave portion X12 is provided with a non-crystal portion X13. That is, no dislocations of the semiconductor layer below the non-crystal portions X13 are transferred to the GaN layer 150 disposed on the non-crystal portions X13. In other words, the thus-formed GaN crystal has satisfactorily low dislocation density. Thus, a Group III nitride semiconductor crystal having excellent crystallinity can be formed.

Notably, Embodiment 2 is given for the purpose of illustration only, and needless to say, those skilled in the art can conceive various modifications and variations, so long as the scope of the invention is not impaired. The number of concave portions provided in the seed crystal is actually a larger number, as compared with the number of concave portions illustrated in the drawings.

Embodiment 3

Embodiment 3 will be described. In Embodiment 3, different from Embodiment 2, the seed crystal etching step by Na molten of Embodiment 2 is not performed.

1. Method for Producing a Group III Nitride Semiconductor Crystal

The method of Embodiment 3 for producing a Group III nitride semiconductor crystal includes the following steps:
(A) Seed crystal preparation step,
(A-1) Mask layer growth step,
(A-2) Protective film formation step,
(A-3) Concave portion formation step, and
(D) Semiconductor crystal formations step,
(D) Semiconductor crystal formations step is slightly different from that of Embodiment 2. Therefore, the differences are mainly described below.

1-1. (D) Semiconductor Crystal Formations Step

In (D) Semiconductor crystal formations step, the seed crystal T10 is still as shown in FIG. 10. A semiconductor crystal is grown using the materials shown in Table 3 under the conditions shown in Table 4. When the temperature and the pressure are increased, the exposed portions E3 of the seed crystal T10 undergo melting back. At this time, the first surface of the seed crystal T10 has the protective film PF and the second surface of the seed crystal T10 has the mask layer 140. The side surfaces of the seed crystal T10 are very thin. Therefore, portions which mainly undergo melting back are the exposed portions E3. As a result, the seed crystal T10 is etched, to thereby yield a seed crystal T11 shown in FIG. 11.

After the flux has been saturated in the semiconductor crystal production apparatus 10, a GaN layer 150 starts to grow from the mask layer 140 as a growth starting point, to thereby produce a GaN crystal 510. This is the same as Embodiment 2.

2. Summary of Embodiment 3

In Embodiment 3, even if (B) Seed crystal etching step is not performed, the exposed portions E3 of the seed crystal T10 are subjected to etching when the temperature and pressure are increased in (D) Semiconductor crystal formation step. However, the thus-formed concave portions X12 assume smaller than those in Embodiment 2. Therefore, the pressure and the temperature are preferably adjusted so as to fully cause melting back (etching).

Embodiment 4

Embodiment 4 will be described. In Embodiment 4, a method for producing a GaN substrate using the method for producing a Group III nitride semiconductor crystal described in Embodiments 2 and 3.

1. Semiconductor Crystal Separation Step

As described above, in the GaN crystal C10 provided with non-crystal portions X13, the GaN layer 150 is readily removed from the growth substrate, since the presence of non-crystal portions X13 reduces adhesion strength to the underlayer or the internal stress is applied to the interface. Therefore, as shown in FIG. 13, the GaN layer 150 is separated from the seed crystal T11. That is, the GaN layer 150 of the GaN crystal C10 is removed from the seed crystal T11. Separation can be manually done by an operator. Separation may be performed through heating/cooling on the basis of the difference in thermal expansion coefficient. The thus-separated crystal exhibits reduced warpage and high quality.

Actually, in some cases, the mask layer 140 and the non-crystal portions X13 are partially adhered to the GaN crystal. In such a case, the bottom surface 151 is ground, to thereby solve the problem.

2. Summary of Embodiment 4

As described above, the method for producing a GaN substrate of Embodiment 4, includes removing the GaN crystal formed in any of Embodiments 2 or 3 from the growth substrate, to thereby provide a GaN self-standing substrate. After the separation step, a step such as grinding may be performed.

EXAMPLE

1. Example 1

1-1. Seed Crystal

Example 1 will be described. In Example 1, similar to Embodiment 2, a c-plane GaN self-standing substrate was employed. The GaN self-standing substrate had a diameter of 2 inches (50.8 mm). After an i-GaN layer was grown so as to have a thickness of 1 μm on the second surface of the GaN self-standing substrate, an AlGaN layer having a thickness of 100 nm was grown. The AlGaN layer had an Al composition ratio of 0.1. The i-GaN layer and the AlGaN layer are epitaxially grown on the GaN self-standing substrate through MOCVD.

Subsequently, through atomic layer deposition, an $Al_2O_3$ film was formed on the first surface so as to have a thickness of 100 nm.

Then, patterning of resist was performed through photolithography. Then, the AlGaN layer and the i-GaN layer were etched by ICP, to thereby a plurality of concave portions. The plane shape of the concave portion was a hexagon. Each side of hexagon had a length of 300 μm. The mask layer had a width of 50 μm.

1-2. Etching

Next, Na (30 g), and C (80 mg) were placed in the etching apparatus. At this time, the carbon proportion of the flux was 0.5 mol %. After the apparatus was evacuated, the inside temperature and pressure were increased. Etching was performed at a temperature of 750° C. and a pressure of 3 MPa.

The mixture was stirred at 20 rpm while appropriately altering the direction of the rotation. The etching was performed for two hours. The gas supplied inside the etching apparatus was nitrogen. Thus, the etched seed crystal was produced.

1-3. Growth

The seed crystal was placed in the semiconductor crystal production apparatus. The raw materials of Ga (30 g), Na (30 g), and C (80 mg) were placed in the semiconductor crystal production apparatus. Then, while supplying nitrogen gas, the inside temperature and pressure were increased. The temperature was 870° C., and the pressure was 3 MPa inside the apparatus. The mixture was stirred at 20 rpm while appropriately altering the direction of the rotation. The growth time of GaN crystal was 30 hours.

1-4. Result

As a result, a GaN crystal was produced. Portions corresponding to non-crystal portions X13 were confirmed to be formed. Therefore, the grown GaN layer could be readily separated from the seed crystal. The grown GaN layer had a thickness of 0.9 mm. The thus-obtained crystal had an average dislocation density of the whole surface of $1 \times 10^5/cm^2$ or less.

NOTES

1. In the etching step, a melt containing at least Na has a temperature of 700° C. to 830° C.
2. In the concave formation step, concave portions are formed so as to have a hexagon shape and disposed in a honeycomb structure.
3. In the etching step, a {10-11} plane of the underlayer is exposed.
4. The protective film is formed through atomic layer deposition.
5. The etching step comprises a mask layer formation step of forming a mask layer made of $Al_XIn_YGa_{(1-X-Y)}N$ (0≤X, 0≤Y, X+Y≤1) on a portion of the second surface of the Group III nitride semiconductor, to thereby form unexposed portions of the second surface, which are covered with the mask layer and the remaining portion of the second surface, which is not covered with the mask layer, and in the etching step, the exposed portions of the second surface of the Group III nitride semiconductor are etched after the mask layer formation step.
6. The mask layer formation step further comprises a mask layer growth step of growing a mask layer so as to uniformly cover the entire second surface of the underlayer made of Group III nitride semiconductor, and a concave portion formation step of forming a plurality of concave portions in the underlayer by removing an area of the mask layer through the full thickness and the corresponding area of the underlayer through a partial thickness.

What is claimed is:

1. A method for etching a Group III nitride semiconductor, the method comprising:
    forming a protective film on a first surface being a N polarity surface of the Group III nitride semiconductor; and
    etching at least a portion of a second surface of the Group III nitride semiconductor in a melt containing at least Na.

2. The method for etching a Group III nitride semiconductor according to claim 1, wherein the method further comprising forming a mask layer made of $Al_XIn_YGa_{(1-X-Y)}N$ ($0 \leq X$, $0 \leq Y$, $X+Y \leq 1$) on a portion of the second surface of the Group III nitride semiconductor; and in etching a Group III nitride semiconductor, the second surface of the Group III nitride semiconductor is etched after the mask layer was formed.

3. The method for etching a Group III nitride semiconductor according to claim 2, wherein the mask layer is formed of AlGaN.

4. The method for etching a Group III nitride semiconductor according to claim 3, wherein the protective film is formed of at least one selected from a group consisting of $Al_2O_3$, $ZrO_2$, and $TiO_2$.

5. The method for etching a Group III nitride semiconductor according to claim 4, wherein the temperature of the melt containing at least Na is 600° C. to 1,000° C.

6. The method for etching a Group III nitride semiconductor according to claim 1, wherein the concentration of Group III metal in the melt containing at least Na is 0 mol % to 5 mol %.

7. A method for producing a Group III nitride semiconductor crystal, the method comprising:

forming a protective film on a first surface being a N polarity surface of Group III nitride semiconductor;

etching at least a portion of a second surface of the Group III nitride semiconductor in a melt containing at least Na, to thereby form a seed crystal; and growing a target layer of Group III nitride semiconductor crystal on the seed crystal in a molten mixture containing at least Group III metal and Na.

8. The method for producing a Group III nitride semiconductor crystal according to claim 7, the method further comprising:

forming a mask layer made of $Al_X In_Y Ga_{(1-X-Y)}N$ ($0 \leq X$, $0 \leq Y$, $X+Y \leq 1$) on a portion of the second surface of the Group III nitride semiconductor, to thereby form an unexposed portion of the second surface which is covered with the mask layer and the remaining portion being an exposed portion of the second surface which is not covered with the mask layer; and etching the exposed portion of the second surface of the Group III nitride semiconductor after the mask layer was formed.

9. The method for producing a Group III nitride semiconductor crystal according to claim 8, wherein the forming a mask layer comprises:

growing an uniform mask layer so as to cover the entire second surface of an underlayer made of the Group III nitride semiconductor; and forming a plurality of concave portions in the underlayer by removing an area of the uniform mask layer to expose a part of the underlayer.

10. The method for producing a Group III nitride semiconductor crystal according to claim 9, wherein, in forming a mask layer, the mask layer is formed of AlGaN.

11. The method for producing a Group III nitride semiconductor crystal according to claim 9, wherein, in etching a Group III nitride semiconductor, a facet plane of the underlayer is exposed.

12. The method for producing a Group III nitride semiconductor crystal according to claim 11, wherein, in forming the target layer, the Group III nitride semiconductor crystal is grown on the mask layer such that the facet plane of the underlayer is not buried with the Group III nitride semiconductor crystal.

13. The method for producing a Group III nitride semiconductor crystal according to claim 12, wherein, in forming the target layer, a non-crystal portion defined by the facet plane and the bottom surface of the target layer is formed.

14. The method for producing a Group III nitride semiconductor crystal according to claim 9, wherein the underlayer has an Al composition ratio of 0 to 0.02; and the Al composition ratio of the underlayer is smaller than that of the mask layer.

15. The method for producing a Group III nitride semiconductor crystal according to claim 9, wherein, in etching the underlayer, the temperature of the melt containing at least Na is 600° C. to 1,000° C.

16. The method for producing a Group III nitride semiconductor crystal according to claim 8, wherein, in forming a protective film, the protective film is formed of at least one selected from a group consisting of $Al_2O_3$, $ZrO_2$, and $TiO_2$.

17. The method for producing a Group III nitride semiconductor crystal according to claim 8, wherein the mask layer is formed of a Group III nitride semiconductor having an Al composition ratio of 0.02 to 1.00.

18. A method for producing a GaN substrate, the method comprising:

forming a protective film on a first surface being a N polarity surface of Group III nitride semiconductor;

etching at least a portion of a second surface of the Group III nitride semiconductor in a melt containing at least Na, to thereby form a seed crystal;

growing a GaN crystal on the seed crystal in a molten mixture containing at least Ga and Na; and separating the GaN crystal from the seed crystal.

* * * * *